(12) United States Patent
Weiser et al.

(10) Patent No.: US 9,703,194 B2
(45) Date of Patent: *Jul. 11, 2017

(54) COMPOSITE COMPRISING A SUBSTRATE AND A PHOTOPOLYMER FILM

(71) Applicant: Covestro Deutschland AG, Leverkusen (DE)

(72) Inventors: Marc-Stephan Weiser, Leverkusen (DE); Horst Berneth, Leverkusen (DE); Friedrich-Karl Bruder, Krefeld (DE); Thomas Rölle, Leverkusen (DE); Dennis Hönel, Zülpich-Wichterich (DE); Thomas Fäcke, Leverkusen (DE)

(73) Assignee: Covestro Deutschland AG, Leverkusen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/032,739

(22) PCT Filed: Oct. 28, 2014

(86) PCT No.: PCT/EP2014/073080
§ 371 (c)(1),
(2) Date: Apr. 28, 2016

(87) PCT Pub. No.: WO2015/063064
PCT Pub. Date: May 7, 2015

(65) Prior Publication Data
US 2016/0282719 A1    Sep. 29, 2016

(30) Foreign Application Priority Data
Oct. 30, 2013   (EP) ..................................... 13190911

(51) Int. Cl.
| | | |
|---|---|---|
| *G03H 1/02* | (2006.01) | |
| *G03F 7/035* | (2006.01) | |
| *G03F 7/028* | (2006.01) | |
| *B42D 25/328* | (2014.01) | |
| *G11B 7/245* | (2006.01) | |
(Continued)

(52) U.S. Cl.
CPC ........... *G03F 7/028* (2013.01); *B42D 25/328* (2014.10); *B42D 25/36* (2014.10); *C08G 18/246* (2013.01); *C08G 18/776* (2013.01); *C08G 18/792* (2013.01); *C08G 18/8175* (2013.01); *C09D 175/16* (2013.01); *G03F 7/0045* (2013.01); *G03H 1/0252* (2013.01); *G11B 7/245* (2013.01);
(Continued)

(58) Field of Classification Search
None
See application file for complete search history.

(56) References Cited

U.S. PATENT DOCUMENTS 7,173,744 B1 * 2/2007 Whiteside ............... G03F 7/001
                                                                  359/3
8,771,903 B2    7/2014 Hönel et al.
(Continued)

FOREIGN PATENT DOCUMENTS

| EP | 0223587 A1 | 5/1987 |
|---|---|---|
| JP | 2010240994 A | 10/2010 |

(Continued)

OTHER PUBLICATIONS

Hostaphan GN technical data sheet (2 pages, 2004) (downloaded from www.cadillac-plastic.es).*

(Continued)

*Primary Examiner* — Martin Angebrannt
(74) *Attorney, Agent, or Firm* — Drinker Biddle & Reath LLP

(57) ABSTRACT

The invention relates to an assembly comprising a substrate and a photopolymer film, which are joined to one another partably at least in sections, the substrate comprising polyethylene terephthalate, and the photopolymer film comprising three-dimensionally crosslinked polyurethane matrix polymers, a writing monomer and a photoinitiator, characterized in that the substrate, after seven-day incubation at 23° C. in a 0.5 volume percent butyl acetate solution of the dye of formula (I)

formula (I)

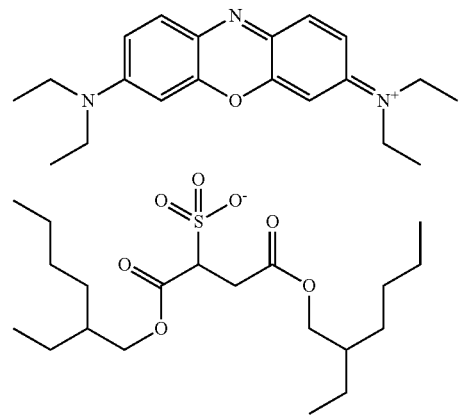

has an L value L1 and before the incubation an L value of L0, the L values being determined by CieLAB measurements, and the difference between the L values L1 and L0 satisfying the formula (II)

$L1-L0>-0.25$     (formula II).

11 Claims, 1 Drawing Sheet

(51) Int. Cl.
- *G11B 7/2535* (2013.01)
- *C08G 18/77* (2006.01)
- *C08G 18/79* (2006.01)
- *C08G 18/81* (2006.01)
- *C08G 18/24* (2006.01)
- *C09D 175/16* (2006.01)
- *B42D 25/36* (2014.01)
- *G03F 7/004* (2006.01)
- *G11B 7/24* (2013.01)

(52) U.S. Cl.
CPC ... *G11B 7/2535* (2013.01); *G03H 2001/0264* (2013.01); *G11B 2007/240025* (2013.01)

(56) References Cited

U.S. PATENT DOCUMENTS

| | | | |
|---|---|---|---|
| 9,073,296 B2* | 7/2015 | Facke | B32B 27/40 |
| 9,146,456 B2 | 9/2015 | Berneth et al. | |
| 9,261,778 B2* | 2/2016 | Weiser | C08G 18/73 |
| 9,551,975 B2* | 1/2017 | Weiser | G03H 1/0011 |
| 2010/0039685 A1* | 2/2010 | Miki | G03H 1/02 |
| | | | 359/3 |
| 2011/0092612 A1* | 4/2011 | Miki | C07D 307/91 |
| | | | 522/154 |
| 2011/0207029 A1 | 8/2011 | Hagen et al. | |
| 2013/0177746 A1* | 7/2013 | Facke | B32B 27/40 |
| | | | 428/195.1 |
| 2013/0224634 A1* | 8/2013 | Berneth | C09B 11/12 |
| | | | 430/2 |
| 2014/0127611 A1* | 5/2014 | Choi | G03H 1/02 |
| | | | 430/2 |
| 2015/0017353 A1* | 1/2015 | Weiser | G03H 1/265 |
| | | | 428/29 |
| 2015/0220056 A1* | 8/2015 | Weiser | G03H 1/0011 |
| | | | 430/2 |
| 2015/0220057 A1* | 8/2015 | Tziovaras | G03H 1/0248 |
| | | | 359/2 |
| 2015/0353485 A1* | 12/2015 | Hagen | C07C 309/17 |
| | | | 359/2 |
| 2016/0252808 A1* | 9/2016 | Berneth | C07F 5/027 |

FOREIGN PATENT DOCUMENTS

| | | |
|---|---|---|
| WO | WO-2010/037515 A1 | 4/2010 |
| WO | WO-2011067057 A1 | 6/2011 |
| WO | WO-2012062655 A2 | 5/2012 |
| WO | 2013-102603 * | 7/2013 |

OTHER PUBLICATIONS

International Search Report for PCT/EP2014/073080 mailed Jan. 22, 2015.

* cited by examiner

Figure 1 shows schematically the construction of the foil coating line for the production of the photopolymer films.

Figure 2 shows the spectrum of a UV lamp used for bleaching (manufacturer data).

COMPOSITE COMPRISING A SUBSTRATE AND A PHOTOPOLYMER FILM

CROSS-REFERENCE TO RELATED APPLICATIONS

This application is a national stage application (under 35 U.S.C. §371) of PCT/EP2014/073080, filed Oct. 28, 2014, which claims benefit of European Application No. 13190911.1, filed Oct. 30, 2013, both of which are incorporated herein by reference in their entirety.

The present invention relates to an assembly comprising a substrate and a photopolymer film, which are joined to one another partably at least in sections, the substrate comprising polyethylene terephthalate, and the photopolymer film comprising three-dimensionally crosslinked polyurethane matrix polymers, a writing monomer and a photoinitiator. Further subjects of the invention are a method for producing the assembly of the invention, a method for producing an isolated photopolymer film, an isolated photopolymer film obtainable by the method, and a method for integrating a photopolymer film.

BACKGROUND OF THE INVENTION

An assembly of the type specified above is known from WO 2011/067057, for example. Described therein is the provision of a photopolymer formulation which comprises three-dimensionally crosslinked polyurethane matrix polymers, a writing monomer and a photoinitiator. This formulation is then applied to a substrate and cured, and forms a photopolymer film. Substrates proposed include polyethylene terephthalate foils.

A disadvantage of the known assembly, however, is the very strong adhesion between substrate and photopolymer film. Parting the photopolymer film from the substrate is therefore possible only using high peel forces, in which case often there may be damage to the photopolymer film. Non-destructive detachment of the exposed photopolymer film from the substrate, however, is critical to its integration into devices such as security documents or display installations.

One theoretical solution to this problem would be to increase the thickness of the photopolymer film, since such films would have an enhanced capacity to withstand the high peel forces. For the majority of photopolymer film applications, however, the need or wish is for the lowest possible layer thickness, and so in the great majority of instances this is not a feasible route.

Alternatively, attempts could be made to reduce the adhesion between substrate and photopolymer film. That could be done using substrates with low surface tension. In that case, however, new problems arise, since producing a photopolymer film with sufficient surface consistency is possible only by the addition to the photopolymer formulation of substantial quantities of highly surface tension-lowering additives. When such quantities of additives of this kind are employed, however, the result in many cases is the clouding of the formulation. In the worst-case scenario, indeed, there is separation of the components. If, on the other hand, smaller amounts of the additives are used, only partial wetting of the substrate with the photopolymer formulation is achieved. The result then is, in turn, photopolymer films which incompletely cover the substrate. Depending on the surface tension of the substrate, however, it is no longer possible to achieve uninterrupted coating in the desired coat thicknesses, even when using large amounts of surface additives. Formulations of these kinds, therefore, cannot be used to obtain useful photopolymer films.

BRIEF SUMMARY OF THE INVENTION

It was an object of the present invention, therefore, to provide an assembly, comprising a substrate and a photopolymer film, wherein the substrate and the photopolymer film are partable from one another easily and in particular without damage to the photopolymer film. At the same time, the amount of surface additives in the photopolymer formulation used for producing the photopolymer film ought not to be higher than 1.5 wt %, preferably not higher than 1.0 wt %, in order to prevent any adverse effect on the optical quality of the photopolymer film.

This object has been achieved by the use of a substrate which after seven-day incubation at 23° C. in a 0.5 volume percent butyl acetate solution of the dye of the formula (I)

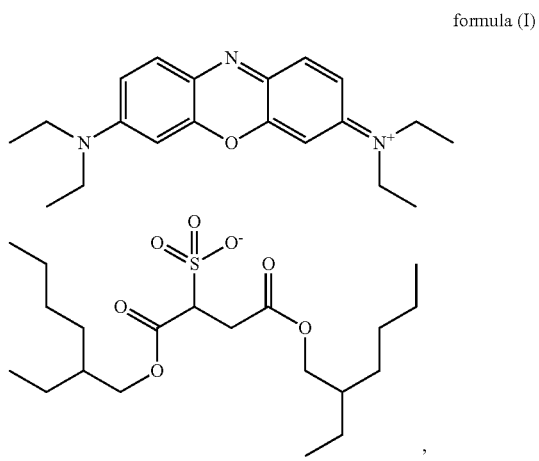

formula (I)

has an L value L1 and, before incubation, an L value of L0, the L values being determined by CieLAB measurements, and where the difference between the L values L1 and L0 satisfies the formula (II)

$$L1-L0 > -0.25 \qquad \text{(formula II)}.$$

It has accordingly been found that, surprisingly, an assembly composed of the photopolymer film and of a polyethylene terephthalate substrate, with L values which satisfy the formula (II), provides ready detachability with no need for chemical modification, using surface additives, of the formulation used for producing the photopolymer film.

DETAILED DESCRIPTION OF THE INVENTION

The dye of the formula (I), Basic Blue 3 bis(2-ethylhexyl) sulphosuccinate, can be prepared by reacting Basic Blue 3, present in the form of the nitrate, for example, with Na bis(2-ethylhexyl)sulphosuccinate. In this reaction there is an exchange of anions, and Basic Blue 3 bis(2-ethylhexyl) sulphosuccinate can be isolated. This reaction may be performed, for example, in water or in alcohols such as methanol, or in mixtures thereof. Advantageously, however, it takes place in a two-phase mixture of water and butyl acetate. In that case the desired dye, Basic Blue 3 bis(2-ethylhexyl)sulphosuccinate, passes into the organic phase, and can be isolated from that phase if desired. More advantageous, however, is to use directly the solution of Basic Blue 3 bis(2-ethylhexyl)sulphosuccinate in butyl acetate, following removal of dissolved water.

In accordance with a first preferred embodiment of the invention, the difference between the L values L1 and L0 satisfies the formula (III)

$$L1-L0 \leq -0.30 \quad \text{(formula III)}.$$

It is likewise preferred if the substrate is a polyethylene terephthalate foil, and more particularly a foil having a thickness of 10 μm to 375 μm, preferably of 19 μm to 175 μm and more preferably of 30 μm to 100 μm.

The photopolymer film may more particularly have a thickness of 1 μm to 100 μm, preferably of 5 μm to 50 μm and more preferably of 10 μm to 28 μm.

In a development of the invention, the photopolymer film is detachable from the substrate with a peel force of 0.05 to 0.75 N/10 mm, preferably of 0.08 to 0.5 N/10 mm and more preferably of 0.1 to 0.25 N/10 mm, the peel force being measured in accordance with DIN Standard EN ISO 11339.

In a further preferred embodiment of the invention, the substrate may have a surface tension of >27 m N/m, preferably of ≥28 mN/m and ≤42.5 mN/m and more preferably of ≥30 mN/m and ≤40 mN/m. The surface tension here is measured in accordance with the method described in the experimental section.

It is also advantageous if the substrate has a surface roughness of Rz≤600 nm, preferably of Rz≤400 nm and more preferably of Rz≤300 nm. The surface tension is measured in accordance with the method described in the experimental section.

It is also preferred if the substrate is of optically transparent design.

in the photopolymer film it is possible in particular for a hologram to have been incorporated by exposure. This may preferably be a volume hologram. This hologram may be a reflection hologram, a transmission hologram or an edgelit hologram. Incorporation by exposure may be performed using a monochromatic laser, in which case an interference field is generated by means of a beam splitter and a broadening of the laser beam. This laser may generate various colours (frequencies of light), and preferably a blue, red, green or yellow emission wavelength may be used. Likewise possible is the use, simultaneously or in succession, of different-coloured lasers. In this way it is possible in particular to generate two-colour or multi-colour reflection holograms.

It is also possible for one or more holograms to be incorporated by exposure at the same site or adjacent to one another into the photopolymer film. If exposure is carried out at the same site, then different images can be incorporated. It is also possible to incorporate different views of one object with slightly varying reconstruction angles, by exposure, so as to form stereograms. It is likewise possible to incorporate hidden holograms and microtexts by exposure. It is equally possible, in the case of transmission holograms, to incorporate by exposure a plurality of light-guiding functions and/or light-guiding functions for different spectral ranges.

The three-dimensionally crosslinked polyurethane matrix polymers are obtainable in particular by reaction of at least one polyisocyanate component a) and at least one isocyanate-reactive component b).

The polyisocyanate component a) comprises at least one organic compound having at least two NCO groups. These organic compounds may more particularly be monomeric di- and triisocyanates, polyisocyanates and/or NCO-functional prepolymers. The polyisocyanate component a) may also comprise or consist of mixtures of monomeric di- and triisocyanates, polyisocyanates and/or NCO-functional prepolymers.

Monomeric di- and triisocyanates used may be all of the compounds well known per se to the skilled person, or mixtures of these compounds. These compounds may have aromatic, araliphatic, aliphatic or cycloaliphatic structures. In minor amounts, the monomeric di- and triisocyanates may also comprise monoisocyanates, i.e. organic compounds having one NCO group.

Examples of suitable monomeric di- and triisocyanates are 1,4-butane diisocyanate, 1,5-pentane diisocyanate, 1,6-hexane diisocyanate (hexamethylene diisocyanate, HDI), 2,2,4-trimethylhexamethylene diisocyanate and/or 2,4,4-trimethylhexamethylene diisocyanate (TMDI), isophorone diisocyanate (IPDI), 1,8-diisocyanato-4-(isocyanatomethyl)octane, bis(4,4'-isocyanatocyclohexyl)methane and/or bis(2',4-isocyanatocyclohexyl)methane and/or mixtures thereof with any desired isomer content, 1,4-cyclohexane diisocyanate, the isomeric bis(isocyanatomethyl)cyclohexanes, 2,4- and/or 2,6-diisocyanato-1-methylcyclohexane (hexahydro-2,4- and/or 2,6-tolylene diisocyanate, $H_6$-TDI), 1,4-phenylene diisocyanate, 2,4- and/or 2,6-tolylene diisocyanate (TDI), 1,5-naphthylene diisocyanate (NDI), 2,4'- and/or 4,4'-diphenylmethane diisocyanate (MDI), 1,3-bis(isocyanatomethyl)benzene (XDI) and/or the analogous 1,4-isomer, or any desired mixtures of the aforementioned compounds.

Suitable polyisocyanates are compounds having urethane, urea, carbodiimide, acyl urea, amide, isocyanurate, allophanate, biuret, oxadiazinetrione, uretdione and/or iminooxadiazinedione structures, which are obtainable from the aforementioned di- or triisocyanates.

With particular preference the polyisocyanates are oligomerized aliphatic and/or cycloaliphatic di- or triisocyanates, and in particular the above aliphatic and/or cycloaliphatic di- or triisocyanates may be used.

Especially preferred are polyisocyanates having isocyanurate, uretdione and/or iminooxadiazinedione structures, and also biurets based on or mixtures thereof.

Suitable prepolymers contain urethane groups and/or urea groups and also, optionally, further structures as specified above, formed by modification of NCO groups. Prepolymers of these kinds are obtainable, for example, by reaction of the abovementioned monomeric di- and triisocyanates and/or polyisocyanates a1) with isocyanate-reactive compounds b1).

Isocyanate-reactive compounds b1) used may be alcohols, amino compounds or mercapto compounds, preferably alcohols. More particularly they may be polyols. With very particular preference, isocyanate-reactive compound b1) used may comprise polyester polyols, polyether polyols, polycarbonate polyols, poly(meth)acrylate polyols and/or polyurethane polyols.

Suitable polyester polyols are, for example, linear polyester diols or branched polyester polyols, which are obtainable in a known way by reaction of aliphatic, cycloaliphatic or aromatic di- and/or polycarboxylic acids and/or their anhydrides with polyhydric alcohols having an OH functionality≥2. Examples of suitable dicarboxylic and polycarboxylic acids are polybasic carboxylic acids such as succinic; adipic, suberic, sebacic, decanedicarboxylic, phthalic, terephthalic, isophthalic, tetrahydrophthalic or trimellitic acid and also acid anhydrides such as phthalic, trimellitic or succinic anhydride, or any desired mixtures thereof with one another. The polyester polyols may also be based on natural raw materials such as castor oil. It is likewise possible for the polyester polyols to be based on homopolymers or copolymers of lactones, which are obtainable preferably by addition reaction of lactones and/or lactone mixtures such as butyrolactone, ε-caprolactone and/or methyl-ε-caprolactone with hydroxy-functional compounds such as polyhydric alcohols with an OH functionality≥2, of the type specified below, for example.

Examples of suitable alcohols are all polyhydric alcohols such as, for example, the $C_2$-$C_{12}$ diols, the isomeric cyclohexanediols, glycerol or any desired mixtures thereof with one another.

Suitable polycarbonate polyols are attainable in a manner known per se by reaction of organic carbonates or phosgene with diols or diol mixtures.

Suitable organic carbonates are dimethyl, diethyl and diphenyl carbonate.

Suitable diols and mixtures comprise the polyhydric alcohols identified in the context of the polyester segments, these alcohols having an OH functionality≥2, preference being given to butane-1,4-diol, hexane-1,6-diol and/or 3-methylpentanediol. Polyester polyols as well may be reworked to give polycarbonate polyols.

Suitable polyether polyols are polyadducts, optionally of blockwise construction, of cyclic ethers with OH— or NH-functional starter molecules.

Examples of suitable cyclic ethers are styrene oxides, ethylene oxide, propylene oxide, tetrahydrofuran, butylene oxide, epichlorohydrin, and any desired mixtures of these.

As starters it is possible to use the polyhydric alcohols specified per se in the context of the polyester polyols, these alcohols having an OH functionality≥2, and also primary or secondary amines and amino alcohols.

Preferred polyether polyols are those of the aforementioned kind exclusively based on propylene oxide, or random or block copolymers based on propylene oxide with further 1-alkylene oxides. Particularly preferred are propylene oxide homopolymers and also random or block copolymers having oxyethylene, oxypropylene and/or oxybutylene units, the fraction of the oxypropylene units being at least 20 wt %, preferably at least 45 wt %, based on the total amount of all of the oxyethylene, oxypropylene and oxybutylene units. Oxypropylene and oxybutylene here encompass all of the respective linear and branched $C_3$ and $C_4$ isomers.

Suitable besides these as constituents of the polyol component b1), as polyfunctional, isocyanate-reactive compounds, are also aliphatic, araliphatic or cycloaliphatic alcohols which have a functionality of two, three or more and are of low molecular weight, in other words having molecular weights ≤500 g/mol, and which are short-chain, in other words containing 2 to 20 carbon atoms.

These may be, for example, in addition to the compounds stated above, neopentyl glycol, 2-ethyl-2-butylpropanediol, trimethylpentanediol, positionally isomeric diethyloctanediols, cyclohexanediol, 1,4-cyclohexanedimethanol, 1,6-hexanediol, 1,2- and 1,4-cyclohexanediol, hydrogenated bisphenol A, 2,2-bis(4-hydroxycyclohexyl)propane or 2,2-dimethyl-3-hydroxypropyl 2,2-dimethyl-3-hydroxypropionate. Examples of suitable triols are trimethylolethane, trimethylolpropane or glycerol. Suitable higher polyfunctional alcohols are di(trimethylolpropane), pentaerythritol, dipentaerythritol or sorbitol.

It is particularly preferred for the polyol component to be a difunctional polyether, polyester or polyether-polyester block copolyester or a polyether-polyester block copolymer with primary OH functions.

As isocyanate-reactive compounds b1) it is likewise possible to use amines. Examples of suitable amines are ethyl-enediamine, propylenediamine, diaminocyclohexane, 4,4'-dicyclohexylmethanediamine, isophoronediamine (IPDA), difunctional polyamines such as, for example, the Jeffamines®, amine-terminated polymers, especially having number-average molar masses ≤10 000 g/mole. Mixtures of the aforementioned amines may likewise be used.

It is likewise possible as isocyanate-reactive compounds b1) to use amino alcohols. Examples of suitable amino alcohols are the isomeric aminoethanols, the isomeric aminopropanols, the isomeric aminobutanols and the isomeric aminohexanols, or any desired mixtures thereof.

All of the aforementioned isocyanate-reactive compounds b1) may be mixed arbitrarily with one another.

It is also preferable for the isocyanate-reactive compounds b1) to have a number-average molar mass of ≥200 and ≤10 000 g/mole, more preferably ≥500 and ≤8000 g/mole and very preferably ≥800 and ≤5000 g/mole. The OH functionality of the polyols is preferably 1.5 to 6.0, more preferably 1.8 to 4.0.

The prepolymers of the polyisocyanate component a) may in particular have a residual free monomeric di- and triisocyanate content <1 wt %, more preferably <0.5 wt % and very preferably <0.3 wt %.

It is optionally also possible for the polyisocyanate component a) to comprise, wholly or proportionally, organic compounds whose NCO groups have been wholly or partly reacted with blocking agents known from coatings technology. Examples of blocking agents are alcohols, lactams, oximes, malonates, pyrazoles, and also amines, such as, for example, butanone oxime, diisopropylamine, diethyl malonate, ethyl acetoacetate, 3,5-dimethylpyrazole, ε-caprolactam, or mixtures thereof.

It is particularly preferred for the polyisocyanate component a) to comprise compounds having aliphatically attached NCO groups, with aliphatically attached NCO groups meaning those groups which are attached to a primary C atom. The isocyanate-reactive component b) preferably comprises at least one organic compound which has on average at least 1.5 and preferably 2 to 3 isocyanate-reactive groups. For the purposes of the present invention, isocyanate-reactive groups are considered to be preferably hydroxyl, amino or mercapto groups.

The isocyanate-reactive component may in particular comprise compounds which have on numerical average at least 1.5 and preferably 2 to 3 isocyanate-reactive groups.

Suitable polyfunctional, isocyanate-reactive compounds of component b) are for example the compounds b1) described above.

Particularly preferred is a combination of components a) and b) in the preparation of the polyurethane matrix polymers consisting of adducts of butyrolactone, ε-caprolactone and/or methyl-ε-caprolactone with polyether polyols with a functionality of 1.8 to 3.1 and with number-average molar masses of 200 to 4000 g/mol in conjunction with isocyanurates, uretdiones, iminooxadiazinediones and/or other oligomers based on HDI. Especially preferred are adducts of ε-caprolactone with poly(tetrahydrofurans) having a functionality of 1.9 to 2.2 and having number-average molar masses of 500 to 2000 g/mol (more particularly 600 to 1400 g/mol), their number-average overall molar mass being from 800 to 4500 g/mole, more particularly from 1000 to 3000 g/mole, in conjunction with oligomers, isocyanurates and/or iminooxadiazinediones based on HDI.

In a further preferred embodiment, the writing monomer comprises or consists of at least one mono- and/or one polyfunctional writing monomer. With further preference the writing monomer may comprise or consist of at least one mono- and/or one polyfunctional (meth)acrylate writing monomer. With very particular preference the writing monomer may comprise or consist of at least one mono- and/or one polyfunctional urethane (meth)acrylate.

Suitable acrylate writing monomers are more particularly compounds of the general formula (V)

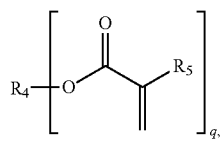

(formula V)

wherein q is $\geq 1$ and q is $\leq 4$ and $R^4$ is a linear, branched, cyclic or heterocyclic organic radical, which is unsubstituted or else optionally substituted by heteroatoms, and/or $R^5$ is hydrogen or a linear, branched, cyclic or heterocyclic organic radical which is unsubstituted or else optionally substituted by heteroatoms. With particular preference $R^5$ is hydrogen or methyl and/or $R^4$ is a linear, branched, cyclic or heterocyclic organic radical which is unsubstituted or else optionally substituted by heteroatoms.

Acrylates and methacrylates are for the present purposes esters of acrylic acid and methacrylic acid respectively. Examples of acrylates and methacrylates which can be used with preference are phenyl acrylate, phenyl methacrylate, phenoxyethyl acrylate, phenoxyethyl methacrylate, phenoxyethoxyethyl acrylate, phenoxyethoxyethyl methacrylate, phenylthioethyl acrylate, phenylthioethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, bisphenol A diacrylate, bisphenol A dimethacrylate, and also their ethoxylated analogues, N-carbazolyl acrylates.

Urethane acrylates for the present purposes are compounds having at least one acrylic ester group and at least one urethane bond. Such compounds may be obtained, for example, by reaction of a hydroxy-functional acrylate or methacrylate with an isocyanate-functional compound.

Examples of isocyanate-functional compounds which can be used for this purpose are monoisocyanates and also the monomeric diisocyanates, triisocyanates and/or polyisocyanates identified under a). Examples of suitable monoisocyanates are phenyl isocyanate, the isomeric methylthiophenyl isocyanates. Di-, tri- or polyisocyanates are stated above, and also triphenylmethane 4,4',4"-triisocyanate and tris(p-isocyanatophenyl) thiophosphate or derivatives thereof with urethane, urea, carbodiimide, acylurea, isocyanurate, allophanate, biuret, oxadiazinetrione, uretdione, iminooxadiazinedione structure, and mixtures thereof. Preference here is given to aromatic di-, tri- or polyisocyanates.

Suitable hydroxy-functional acrylates or methacrylates for preparing urethane acrylates include, for example, compounds such as 2-hydroxyethyl(meth)acrylate, polyethylene oxide mono(meth)acrylates, polypropylene oxide mono (meth)acrylates, polyalkylene oxide mono(meth)acrylates, poly(ε-caprolactone) mono(meth)acrylates, such as Tone® M100 (Dow, Schwalbach, Del.), 2-hydroxypropyl(meth) acrylate, 4-hydroxybutyl(meth)acrylate, 3-hydroxy-2,2-dimethylpropyl(meth)acrylate, hydroxypropyl(meth)acrylate, 2-hydroxy-3-phenoxypropyl acrylate, the hydroxy-functional mono-, di- or tetraacrylates of polyhydric alcohols such as trimethylolpropane, glycerol, pentaerythritol, dipentaerythritol, ethoxylated, propoxylated or alkoxylated trimethylolpropane, glycerol, pentaerythritol, dipentaerythritol or technical mixtures thereof. Preferred are 2-hydroxyethyl acrylate, hydroxypropyl acrylate, 4-hydroxybutyl acrylate and poly(ε-caprolactone) mono(meth)acrylate.

Use may likewise be made of the conventional hydroxyl-containing epoxy(meth)acrylates having OH contents of 20 to 300 mg KOH/g or hydroxyl-containing polyurethane (meth)acrylates having OH contents of 20 to 300 mg KOH/g or acrylated polyacrylates having OH contents of 20 to 300 mg KOH/g, and also mixtures thereof with one another, and mixtures with hydroxyl-containing unsaturated polyesters, and also mixtures with polyester (meth)acrylates, or mixtures of hydroxyl-containing unsaturated polyesters with polyester (meth)acrylates.

Preferred more particularly are urethane acrylates obtainable from the reaction of tris(p-isocyanatophenyl) thiophosphate and/or m-methylthiophenyl isocyanate with alcohol-functional acrylates such as hydroxyethyl(meth)acrylate, hydroxypropyl(meth)acrylate and/or hydroxybutyl(meth) acrylate.

It is also possible for the writing monomer to comprise or consist of further unsaturated compounds such as α,β-unsaturated carboxylic acid derivatives such as, for example, maleates, fumarates, maleimides, acrylamides, and also vinyl ethers, propenyl ethers, allyl ethers and compounds containing dicyclopentadienyl units, and also olefinically unsaturated compounds such as styrene, α-methylstyrene, vinyltoluene and/or olefins, for example.

In a further preferred embodiment the photopolymer film additionally comprises urethanes as additives, it being possible for the urethanes to be substituted in particular by at least one fluorine atom.

These urethanes are preferably urethanes of the general formula (IV),

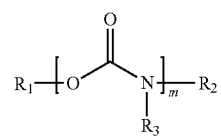

(IV)

in which m is $\geq 1$ and m is $\leq 8$ and $R_1$ is a linear, branched, cyclic or heterocyclic organic radical which is unsubstituted or else optionally substituted by heteroatoms, and/or $R_2$ and $R_3$ independently of one another are hydrogen, and preferably at least one of the radicals $R_1$, $R_2$ and $R_3$ is substituted by at least one fluorine atom, and more preferably $R_1$ is an organic radical having at least one fluorine atom, and very preferably $R_3$ is a linear, branched, cyclic or heterocyclic organic radical which is unsubstituted or else optionally substituted by heteroatoms such as fluorine, for example.

Photoinitiators of component d) are customarily compounds which can be activated by actinic radiation and which are able to initiate polymerization of the writing monomers. Among the photoinitiators, a distinction may be made between unimolecular (type I) and bimolecular (type II) initiators. In addition, they are distinguished according to their chemical nature into photoinitiators for radical, anionic, cationic or mixed mode of polymerization.

Type I photoinitiators (Norrish type I) for radical photopolymerization form free radicals on irradiation, as a result of a unimolecular bond scission. Examples of type I photoinitiators are triazines, oximes, benzoin ethers, benzyl ketals, bisimidazoles, aroylphosphine oxides, sulphonium salts and iodonium salts.

Type II photoinitiators (Norrish type II) for radical polymerization consist of a dye as sensitizer and of a coinitiator, and undergo a bimolecular reaction on irradiation with light adapted to the dye. First of all, the dye absorbs a photon and, from an excited state, transfers energy to the coinitiator. This coinitiator releases the polymerization-initiating radicals as a result of electron transfer or proton transfer or of direct hydrogen abstraction.

For the purposes of this invention, type II photoinitiators are used with preference.

Such photoinitiator systems are described in principle in EP 0 223 587 A and consist preferably of a mixture of one or more dyes with ammonium alkylarylborate(s).

Suitable dyes which together with an ammonium alkylarylborate form a type II photoinitiator are the cationic dyes described in WO 2012062655, in combination with the anions also described therein.

Cationic dyes are preferably those of the following classes: acridine dyes, xanthene dyes, thioxanthene dyes, phenazine dyes, phenoxazine dyes, phenothiazine dyes, tri(het)arylmethane dyes—especially diamino and triamino(het)arylmethane dyes, mono-, di-, tri- and pentamethinecyanine dyes, hemicyanine dyes, externally cationic merocyanine dyes, externally cationic neutrocyanine dyes, nullmethine dyes—especially naphtholactam dyes, streptocyanine dyes. Such dyes are described for example in H. Berneth in Ullmann's Encyclopedia of Industrial Chemistry, Azine Dyes, Wiley-VCH Verlag, 2008, H. Berneth in Ullmann's Encyclopedia of Industrial Chemistry, Methine Dyes and Pigments, Wiley-VCH Verlag, 2008, T. Gessner, U. Mayer in Ullmann's Encyclopedia of Industrial Chemistry, Triarylmethane and Diarylmethane Dyes, Wiley-VCH Verlag, 2000, Particularly preferred are phenazine dyes, phenoxazine dyes, phenothiazine dyes, tri(het)arylmethane dyes—especially diamino and triamino(het)arylmethane dyes, mono-, di-, tri- and pentamethinecyanine dyes, hemicyanine dyes, nullmethine dyes—especially naphtholactam dyes, streptocyanine dyes.

Examples of cationic dyes are Astrazone Orange G, Basic Blue 3, Basic Orange 22, Basic Red 13, Basic Violet 7, Methylene Blue, New Methylene Blue, Azure A, 2,4-diphenyl-6-(4-methoxyphenyl)pyrylium, Safranin O, Astraphloxin, Brilliant Green, Crystal Violet, Ethyl Violet and Thionine.

Preferred anions are, in particular, $C_8$ to $C_{25}$ alkanesulphonate, preferably $C_{13}$ to $C_{25}$ alkanesulphonate, $C_3$ to $C_{18}$ perfluoroalkanesulphonate, $C_4$ to $C_{18}$ perfluoroalkanesulphonate carrying at least 3 hydrogen atoms in the alkyl chain, $C_9$ to $C_{25}$ alkanoate, $C_9$ to $C_{25}$ alkenoate, $C_8$ to $C_{25}$ alkylsulphate, preferably $C_{13}$ to $C_{25}$ alkylsulphate, $C_8$ to $C_{25}$ alkenylsulphate, preferably $C_{13}$ to $C_{25}$ alkenylsulphate, $C_3$ to $C_{18}$ perfluoroalkylsulphate, $C_4$ to $C_{18}$ perfluoroalkylsulphate carrying at least 3 hydrogen atoms in the alkyl chain, polyethersulphates based on at least 4 equivalents of ethylene oxide and/or equivalents 4 of propylene oxide, bis-$C_4$ to $C_{25}$ alkyl, $C_5$ to $C_7$ cycloalkyl, $C_3$ to $C_8$ alkenyl or $C_7$ to $C_{11}$ aralkyl sulphosuccinate, bis-$C_2$ to $C_{10}$ alkyl-sulphosuccinate substituted by at least 8 fluorine atoms, $C_8$ to $C_{25}$ alkylsulphoacetates, benzenesulphonate substituted by at least one radical from the group of halogen, $C_4$ to $C_{25}$ alkyl, perfluoro-$C_1$ to $C_8$ alkyl and/or $C_1$ to $C_{12}$ alkoxycarbonyl, naphthalenesulphonate or biphenylsulphonate optionally substituted by nitro, cyano, hydroxyl, $C_1$ to $C_{25}$ alkyl, $C_1$ to $C_{12}$ alkoxy, amino, $C_1$ to $C_{12}$ alkoxycarbonyl or chloro, benzene-, naphthalene- or biphenyldisulophonate optionally substituted by nitro, cyano, hydroxyl, $C_1$ to $C_{25}$ alkyl, $C_1$ to $C_{12}$ alkoxy, $C_1$ to $C_{12}$ alkoxycarbonyl or chloro, benzoate substituted by dinitro, $C_6$ to $C_{25}$ alkyl, $C_4$ to $C_{12}$ alkoxycarbonyl, benzoyl, chlorobenzoyl or toluoyl, the anion of naphthalenedicarboxylic acid, diphenyl ether disulphonate, sulphonated or sulphated, optionally at least monounsaturated $C_8$ to $C_{25}$ fatty acid esters of aliphatic $C_1$ to $C_8$ alcohols or glycerol, bis(sulpho-$C_2$ to $C_5$ alkyl)-$C_3$ to $C_{12}$ alkanedicarboxylic esters, bis-(sulpho-$C_2$ to $C_6$ alkyl)itaconic esters, (sulpho-$C_2$ to $C_6$ alkyl)-$C_6$ to $C_{18}$ alkanecarboxylic esters, (sulpho-$C_2$ to $C_6$ alkyl)-acrylic or methacrylic esters, triscatechol phosphate optionally substituted by up to 12 halogen radicals, an anion of the group tetraphenylborate, cyanotriphenylborate, tetraphenoxyborate, $C_4$ to $C_{12}$ alkyl-triphenylborate, whose phenyl or phenoxy radicals may be substituted by halogen, by $C_1$ to $C_4$ alkyl and/or by $C_1$ to $C_4$ alkoxy, $C_4$ to $C_{12}$ alkyl-trinaphthylborate, tetra-$C_1$ to $C_{20}$ alkoxyborate, 7,8- or 7,9-dicarba-nido-undecaborate(1-) or (2-), optionally substituted on the B and/or C atoms by one or two $C_1$ to $C_{12}$ alkyl or phenyl groups, dodecahydrodicarbadodecaborate(2-) or B-$C_1$ to $C_{12}$ alkyl-C-phenyl-dodecahydro-dicarbadodecaborate(1-), where $A^-$ in the case of polyvalent anions such as naphthalenedisulphonate stands for one equivalent of this anion, and where the alkane and alkyl groups may be branched and/or may be substituted by halogen, cyano, methoxy, ethoxy, methoxycarbonyl or ethoxycarbonyl.

It is also preferable for the anion $A^-$ of the dye to have an AClogP in the range from 1 to 30, more preferably in the range from 1 to 12 and especially preferably in the range from 1 to 6.5. The AClogP is computed as described in J. Comput. Aid. Mol. Des, 2005, 19, 453; Virtual Computational Chemistry Laboratory, http://www.vcclab.org.

Examples of suitable ammonium alkylarylborates are (Cunningham et al., RadTech'98 North America UV/EB Conference Proceedings, Chicago, Apr. 19-22, 1998): tetrabutylammonium triphenylhexylborate, tetrabutylammonium triphenylbutylborate, tetrabutylammonium trinaphthylhexylborate, tetrabutylammonium tris(4-tert-butyl)phenylbutylborate, tetrabutylammonium tris(3-fluorophenyl)hexylborate hexylborate ([191726-69-9], CGI 7460, product of BASF SE, Basel, Switzerland), 1-methyl-3-octylimidazolium dipentyldiphenylborate and tetrabutylammonium tris (3-chloro-4-methylphenyl)hexylborate ([1147315-11-4], CGI 909, product of BASF SE, Basel, Switzerland).

It may be advantageous to use mixtures of these photoinitiators. Depending on the radiation source employed, it is necessary to adapt the type and concentration of photoinitiator, in the manner known to the skilled person. Further details are described in, for example, P. K. T. Oldring (Ed.), Chemistry & Technology of UV & EB Formulations For Coatings, Inks & Paints, Vol. 3, 1991, SITA Technology, London, pp. 61-328.

It is especially preferred for the photoinitiator to comprise a combination of dyes, the absorption spectra of which at least partly cover the spectral range from 400 to 800 nm, with at least one coinitiator matched to the dyes.

It is also preferable if at least one photoinitiator suitable for a laser light colour selected from blue, green and red is present in the photopolymer formulation.

It is also further preferred if the photopolymer formulation comprises one suitable photoinitiator each for at least two laser light colours selected from blue, green and red.

It is especially preferred, lastly, if the photopolymer formulation comprises a suitable photoinitiator for each of the laser light colours blue, green and red in each case.

The present invention further provides a method for producing an assembly of the invention, in which a photopolymer formulation comprising a polyisocyanate component, an isocyanate-reactive component, a writing monomer and a photoinitiator is applied to the substrate and cured to form the photopolymer film.

Likewise provided by the invention is a method for producing an isolated photopolymer film, in which the photopolymer film and the substrate of an assembly of the invention are separated completely from one another.

Yet further provided by the invention is an isolated photopolymer film obtainable by the above method.

A method for integrating a photopolymer film, in which an isolated photopolymer film of the invention is integrated into a device, is also provided by the invention.

In accordance with one preferred embodiment of the above method, the device may be a display or a security document.

The invention is elucidated in more detail below by means of examples.

EXAMPLES

Figure 1:
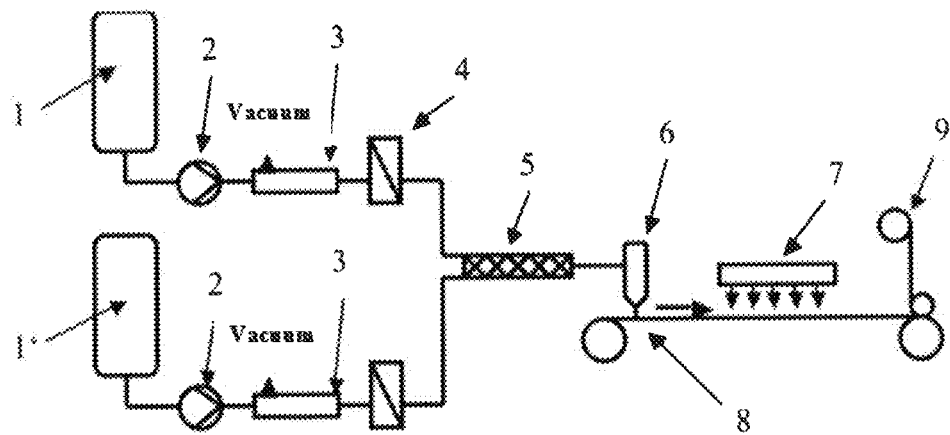
FIG. 1 shows schematically the construction of the foil coating line for the production of the photopolymer films.

Measurement Methods:

Measurement of the Dry Film Thickness of the Photopolymer Film

The physical layer thickness was determined using commercial white-light interferometers, such as the FTM-Lite NIR layer thickness measuring instrument from Ingenieursbüro Fuchs.

The layer thickness was determined in principle on the basis of interference phenomena at thin layers. Light waves reflected from two interfaces with different optical densities were superimposed on one another. The undistorted superimposition of the reflected component beams leads to periodic brightening and extinction in the spectrum of a white continuum emitter (e.g., halogen lamp). This superimposition is called interference by the skilled person. The interference spectra were measured and evaluated mathematically.

Solids Content

About 1 g of the respective sample was applied in an uncoated can lid and spread out effectively by means of a paperclip. Can lid and paperclip were weighed beforehand. The sample together with paperclip and can lid was then dried in an oven at 125° C. for an hour. The solids content was obtained as follows: (final tare mass)*100/(initial tare mass).

Viscosity

The viscosities were determined in accordance with DIN EN ISO 32191A.3 at 23° C. with a shear rate of 40

Isocyanate Content (NCO Content)

The NCO values (isocyanate contents) were determined in accordance with DIN EN ISO 11909.

Production of the Test Specimens for the LAB Measurement:

Two foil samples of each of the substrates under investigation were cut to an approximate size of 2 cm×3 cm. One foil sample was then incubated in a 0.5 volume percent butyl acetate solution of C.I. Basic Blue 3 in the form of the bis(2-ethylhexyl)sulphosuccinate at 23° C. for 7 days.

Thereafter the sample was taken from the solution, dabbed dry with a paper cloth and dried in the air.

Measurement of the L Value According to the CIELAB System

The measurements were conducted on a sphere spectrometer of the Hunter Ultrascan Pro type from Hunter Lab, FMS Jansen GmbH & Co. KG, Murnau am Staffelsee, Germany, based on the standard ASTM E 308 for L*a*b*, The measurement was carried out using the D65 illuminant at an observation angle of 10°. The measurement range went from 350 nm 1100 nm, with measurement only up to 850 nm for the colorimetric determination. For the purpose of calibration, a measurement in air was carried out, and the transmittance of this measurement was set at 100%.

For each substrate under investigation, determinations were made both of the L0 value of the unincubated foil sample, and of the L1 value of the incubated foil sample.

The difference was then formed between the L1 and L0 values. If this difference was less than or equal to −0.25, the substrate was classed as suitable in accordance with the invention.

Measurement of the Surface Tension σ on Substrates

The measurement took place using an instrument of type OCA 20 from DataPhysics Instruments GmbH, Filderstadt, Germany. The surface tension was calculated from the contact angles by the method of Owens-Wendt using the SCA21 software. For the measurement of the contact angles, 3 μl of a measuring liquid was applied to each of the substrates under investigation. A USB-CCIR camera took pictures of the droplet at a frequency of 20 images per second. 4 seconds following application of the droplet, the contact angle was evaluated automatically. At least 5 individual measurements per substrate and measuring liquid were carried out, in order to obtain a sufficient statistical base. Measuring liquids used were double-distilled water, fresh diiodmethane and ethylene glycol.

The instrument-specific measurement accuracy for the contact angle was ±0.1° according manufacturer data.

Measurement of the Peel Forces

The measurement took place using a tensile testing machine in accordance with DIN EN ISO 527-1. Measurements were made of the tensile force and travel of the tensile traverse. The tensile force was defined as peel force or bonding force, and the traverse travel as peel travel, represented graphically in the form of a tensile force/peel travel diagram. The bonding force was the average value of the tensile forces between 20 and 100 mm peel travel. In accordance with DIN EN ISO 11339 (180° peel test, T-peel test), the peel strength was defined as peel force relative to the overall sample width. The sample was at least 80 mm long, with the clamped length in the tensioning clamps being 20 mm. The peel travel was 60 mm, corresponding to a travel of the tensile traverse of 120 mm. The tensioning rate was 100 mm/min. The tensile force was measured with a 50 N force transducer.

Materials Employed

Overview of the Substrates Used:

Substrate foil 1 is Hostaphan GN 50 CT01B (σ=37.9 mN/m) and was obtained from Mitsubishi Polyester Film GmbH, Wiesbaden, Germany.

Substrate foil 2 is Excel XG 532 (σ=38.5 mN/m) and was obtained from Toray International Europe GmbH, Neu-Isenburg, Germany.

Substrate foil 3 is Excell XG6SF2 (σ36.9 mN/m) and was obtained from Toray International Europe GmbH, Neu-Isenburg, Germany.

Substrate foil 4 is Lumirror U32 (σ36.4 mN/m) and was obtained from Toray International Europe GmbH, Neu-Isenburg, Germany.

Substrate foil 5 is Lumirror U40 (σ=37.3 mN/m) and was obtained from Toray International Europe GmbH, Neu-Isenburg, Germany.

Substrate foil C1 is Hostaphan RNK 36 (σ=48.3 mN/m) and was obtained from Mitsubishi Polyester Film GmbH, Wiesbaden, Germany.

Substances Employed for the Photopolymer Films:

Component A: experimental product of Bayer MaterialScience AG, Leverkusen, Germany; its preparation is described below.

Component B1 (phosphorothioyltris(oxy-4,1-phenyleniminocarbonyloxyethane-2,1-diyl)triacrylate): experimental product of Bayer MaterialScience AG, Leverkusen, Germany; its preparation is described below, Component B2 (2-({[3-(methylsulphanyl)phenyl]carbamoyl}oxy)ethyl prop-2-enoate): experimental product of Bayer MaterialScience AG, Leverkusen, Germany; its preparation is described below.

Component C (bis(2,2,3,3,4,4,5,5,6,6,7,7-dodecafluoroheptyl) (2,2,4-trimethylhexane-1,6-diyl)biscarbamate): experimental product of Bayer MaterialScience AG, Leverkusen, Germany; its preparation is described below.

Component D: Fascat 4102 0.07%, urethanization catalyst, butyltin tris(2-ethylhexanoate), product of Arkema Düsseldorf, Germany.

BYK® 310: silicone-based surface additive from BYK-Chemie GmbH, Wesel, 25% strength solution in xylene.

Component E: C.I. Basic Blue 3 (converted to bis(2-ethylhexyl)sulphosuccinate salt) 0.26%, Safranin O (converted to bis(2-ethylhexyl)sulphosuccinate salt) 0.13% and Astrazone Orange G (converted to bis(2-ethylhexyl)sulphosuccinate salt) 0.13% with CGI 909, experimental product of BASF SE, Basel, Switzerland, 1.5%, as solution in 5.8% ethyl acetate. Percentages are based on the overall formulation of the medium.

Component F: ethyl acetate (CAS No. 141-78-6).

Component G: Desmodur® N 3900, commercial product of Bayer MaterialScience AG, Leverkusen, Germany, hexane diisocyanate-based polyisocyanate, iminooxadiazinedione fraction at least 30%, NCO content: 23.5%.

Preparation Protocols for the Substances Employed:

Preparation of Component A:

A 1 L flask was charged with 0.18 g of tin octoate, 374.8 g of ε-caprolactone and 374.8 g of a difunctional polytetrahydrofuran polyether polyol (equivalent weight 500 g/mole OH), and this initial charge was heated to 120° C. and held at that temperature until the solids content (fraction of the nonvolatile constituents) was 99.5 wt % or above. Subsequently it was cooled and the product was obtained as a waxy solid.

Preparation of Component B1 (phosphorothioyltris(oxy-4,1-phenyleniminocarbonyl-oxyethane-2,1-diyl) triacrylate):

A 500 mL round-bottomed flask was charged with 0.1 g of 2,6-di-tert-butyl-4-methylphenol, 0.05 g of dibutyltin dilaurate (Desmorapid® Z, Bayer MaterialScience AG, Leverkusen, Germany) and with 213.07 g of a 27% strength solution of tris(p-isocyanatophenyl) thiophosphate in ethyl acetate (Desmodur® RFE, product of Bayer MaterialScience AG, Leverkusen, Germany) and this initial charge was heated to 60° C. Then 42.37 g of 2-hydroxyethyl acrylate were added dropwise and the mixture was held further at 60° C. until the isocyanate content had dropped below 0.1%. Thereafter it was cooled and the ethyl acetate was removed in full under vacuum. The product was obtained as a partially crystalline solid.

Preparation of Component B2 (2-({[3-(methylsulphanyl)phenyl]carbamoyl}oxy)ethyl prop-2-enoate):

A 100 mL round-bottomed flask was charged with 0.02 g of 2,6-di-tert-butyl-4-methylphenol, 0.01 g of Desmorapid® Z, 11.7 g of 3-(methylthio)phenyl isocyanate and initially introduced and this initial charge was heated to 60° C. Then 8.2 g of 2-hydroxyethyl acrylate were added dropwise and the mixture was held further at 60° C. until the isocyanate content had dropped below 0.1%. Thereafter it was cooled. The product was obtained as a pale yellow liquid.

Preparation of the additive C (bis(2,2,3,3,4,4,5,5,6,6,7,7-dodecafluoroheptyl) (2,2,4-trimethylhexane-1,6-diyl)biscarbamate):

A 2000 mL round-bottomed flask was charged with 0.02 g of Desmorapid® Z and 3.60 g of 2,4,4-trimethylhexane 1,6-diisocyanate (TMDI) and this initial charge was heated to 70° C. Then 11.39 g of 2,2,3,3,4,4,5,5,6,6,7,7-dodecafluoroheptan-1-ol were added dropwise and the mixture was held further at 70° C. until the isocyanate content had dropped below 0.1%. Thereafter it was cooled. The product was obtained as a colourless oil.

Preparation of Basic Blue 3 bis(2-ethylhexyl)sulphosuccinate 15.0 g of sodium bis(2-ethylhexyl)sulphosuccinate were dissolved in 350 ml of water at 50° C. 24.5 g of the dye of the formula

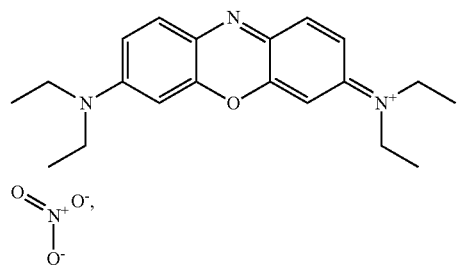

(Basic Blue 3), as 53 wt % product, and 220 ml of butyl acetate were added and the mixture was stirred at 50° C. for 4 hours. The aqueous phase was removed and the organic phase was stirred three times with 50 ml of fresh water at 50° C. Finally the aqueous phase was removed each time, the last phase at room temperature. The deep-blue organic phase was dried initially with anhydrous magnesium sulphate, then filtered and freed from the remaining water by azeotropic distillation at 150 mbar. Addition of anhydrous butyl acetate, lastly, gave 250 g of deep-blue solution, containing 9.68 wt % of the dye of the formula

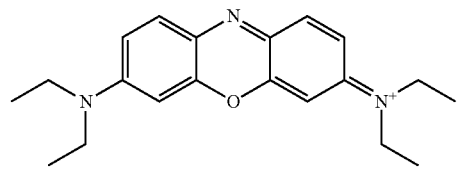

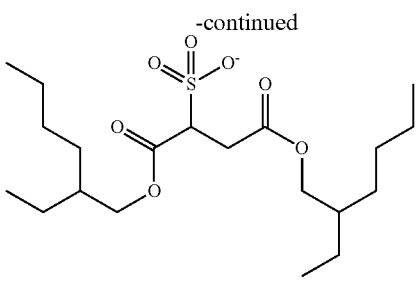

(96.4% of theory).

$\lambda_{max}$ in methanol: 643 nm.

After appropriate dilution, this solution was used directly for testing in accordance with the invention.

Producing the Assemblies of Substrate and Photopolymer Film on a Foil Coating Unit For production, the foil coating unit represented in FIG. 1 was used, with the individual components being assigned the following reference numerals:

1 First reservoir container
1' Second reservoir container
2 Metering device
3 Vacuum degassing device
4 Filter
5 Static mixer
6 Coating device
7 Forced-air dryer
8 Substrate foil
9 Liner layer To produce a photopolymer formulation, 304.3 g of Component A in a stirring vessel were admixed in steps with a writing monomer mixture of 138 g of Component B1 and 138 g of Component B2, with 191 g of Additive C, 0.60 g of Component D, 2.55 g of BYK® 310 and 101 g of Component F, and these components were mixed. Then 66.5 g of Component E were added to the mixture in the dark and the composition was mixed so as to give a clear solution. If necessary, the formulation was heated at 60° C. for a short time in order to bring the ingredients into solution more rapidly.

This mixture was subsequently introduced into the first reservoir container 1 of the coating unit. Introduced into the second reservoir container 1' was Component G (polyisocyanate). Both components were then conveyed to the vacuum degassing device 3, in each case by the metering devices 2, in a ratio of 942.2 (Components A to F) to 57.8 (Component G), and degassing was carried out. From there, they were then each passed through the filter 4 into the static mixer 5, where the components were mixed to form the photopolymer formulation. The liquid material obtained was then supplied in the dark to the coating device 6.

The coating device 6 is in the present case a slot die, with which the skilled person is familiar. Alternatively, however, a doctor blade system may also be employed. Using the coating device 6, the photopolymer formulation was applied to the respective substrate foil 8 at a processing temperature of 20° C., and dried in a forced-air dryer 7 at a crosslinking temperature of 80° C. for 5.8 minutes. This gave an assembly in the form of a film, which was then provided with a 40 µm thick polyethylene-foil liner layer 9, and wound up.

The layer thickness obtained for the film was 18 µm±1 µm.

Figure 2:
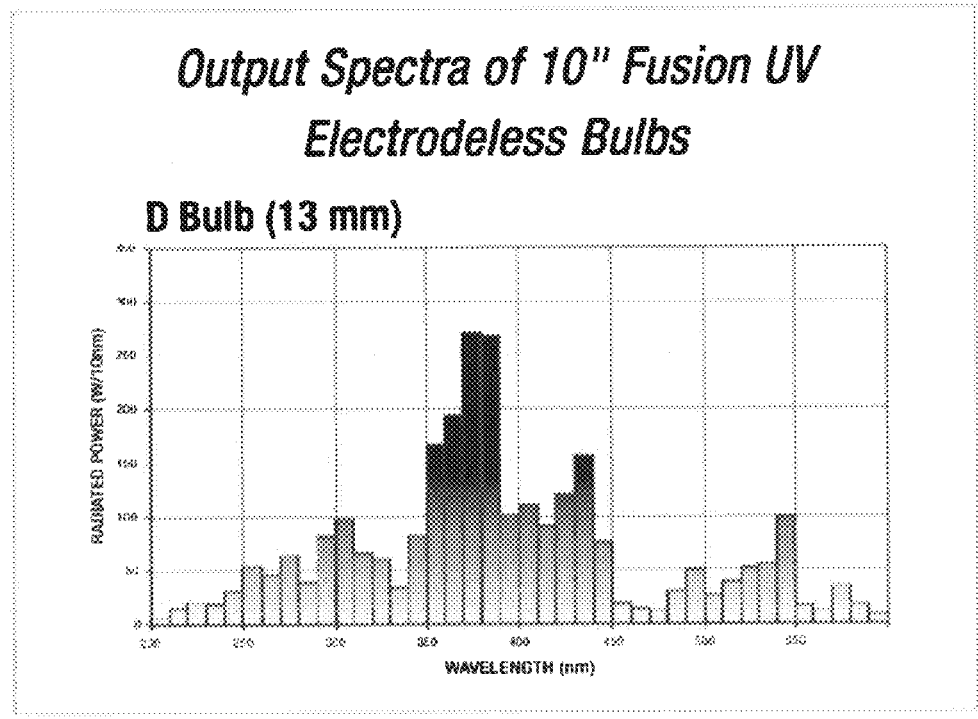
FIG. 2 shows the spectrum of a UV lamp used for bleaching (manufacturer data).

Production of the Specimens for the Measurement of the Peel Forces of the Exposed and Unexposed Photopolymer If the adhesion between substrate foil and photopolymer film is less than that between liner layer and photopolymer film, the assembly can be measured as it is, without any need for the liner layer to be removed beforehand. For this purpose, a section measuring 10 cm×20 cm was cut from the assembly and placed on the conveyor belt of a UV source, and exposed twice with a belt speed of 2.5 m/min. The UV source used was an iron-doped Hg lamp of type Fusion UV "D Bulb" No. 558434 KR 85 with an overall power density of 80 W/cm$^2$. The spectrum of the lamp used is shown in FIG. 2 (manufacturer data). The parameters correspond to a dose of 2×2.0 J/cm$^2$, measured with an ILT 490 light bug. By "dose", generally, is meant in each case the quantity of light actually acting on the photopolymer film. Then strips with a width of 10 mm and a length of approximately 12 cm were cut from the exposed assembly, and then these strips were used for measurement, by the method described above, of the force needed to peel off the substrate foil.

If the adhesion between liner layer and photopolymer film is less than that between substrate foil and photopolymer film, the liner layer was first of all removed manually. Then a section measuring 10 cm×20 cm was cut from the assembly, consisting of photopolymer film and substrate foil, and was laminated to a glass plate and then exposed twice with the UV source, as described above. Thereafter the section of the assembly, using a roll laminator at 100° C. with the photopolymer film side, was adhered to the smooth side of a polycarbonate foil of type Makrofol DE 1-4 (product of Bayer MaterialScience AG, Leverkusen, Germany), using a hot-melt adhesive foil based on a thermoplastic polyurethane of type Platilon HU2 from Epurex Films GmbH & Co. KG, Walsrode, Germany. Strips with a width of 10 mm and a length of approximately 12 cm were then cut from the assembly, and then these strips were used, in accordance with the method described above, to measure the force required to peel off the substrate foil.

Results of the Measurements of the Peel Forces to DIN EN ISO 11339:

| Substrate foil | L1 − L0 | Peel force P exposed |
|---|---|---|
| 1 | −0.75 | 0.12 * |
| 2 | −0.97 | 0.10 * |
| 3 | −0.30 | 0.15 * |
| 4 | −0.48 | 0.16 |
| 5 | −3.51 | 0.17 |
| C1 | −0.04 | 3.6 |

Values in N/10 mm,
* Sample measurement on 15 mm sample width.

As is evident from the table above, peel forces needed for detachment of the photopolymer film were measured for substrate foils 1-8, and are situated in the region less than 0.25 N/mm. This shows that for the assemblies which comprise one of these substrate foils, the separation of substrate foil from photopolymer film is possible easily and in particular without damage to the photopolymer film.

Furthermore, the differences between the L1 and L0 values were measured for each of the substrate foils 1-8. They are all less than −0.25. This demonstrates that the difference in the L values and the criterion of formula (II) is suitable for the identification of readily detachable substrate foils.

Comparative Example C1 shows in turn that when the difference between L1 and L0 is greater than −0.25, the peel forces needed for detachment of the photopolymer film from the substrate foil are also considerably greater. These forces are so great that damage to the photopolymer film may occur during the operation. Consequently, the substrate foil C1 is not suitable for solving the problem addressed by the invention, as was already evident from the consideration of the difference between the L values.

The invention claimed is:

1. An assembly comprising a substrate and a photopolymer film, which are joined to one another partably at least in sections, the substrate comprising polyethylene terephthalate, and the photopolymer film comprising three-dimensionally crosslinked polyurethane matrix polymers, a writing monomer and a photoinitiator, wherein the substrate, after seven-day incubation at 23° C. in a 0.5 volume percent butyl acetate solution of the dye of formula (I)

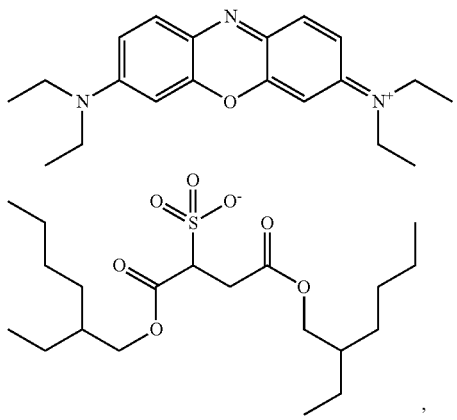

formula (I)

has an L value L1 and before the incubation an L value of L0, the L values being determined by CieLAB measurements, and the difference between the L values L1 and L0 satisfying the formula (II)

$$L1-L0<-0.25 \qquad \text{(formula II)},$$

and wherein the substrate has a surface tension of ≥28 mN/m and ≤42.5 mN/m.

2. The assembly according to claim 1, wherein the difference between the L values L1 and L0 satisfies the formula (III)

$$L1-L0\leq-0.30 \qquad \text{(formula III)}.$$

3. The assembly according to either of claim 1, wherein the substrate is a foil, and more particularly a foil having a thickness of 10 μm to 375 μm.

4. The assembly according to any of claim 1, wherein the photopolymer film has a thickness of 5 μm to 100 μm.

5. The assembly according to claim 1, wherein the photopolymer film is detachable from the substrate with a peel force of 0.05 to 0.75 N/10 mm, the peel force being measured in accordance with DIN Standard EN ISO 11339.

6. The assembly according to claim 1, wherein the substrate has a surface roughness of Rz≤600 nm.

7. The assembly according to claim 1, wherein the writing monomer comprises or consists of at least one mono- and/or one polyfunctional writing monomer, preferably at least one mono- and/or polyfunctional acrylate writing monomer and more preferably at least one monofunctional and/or one polyfunctional urethane (meth)acrylate.

8. The assembly according to claim 1, wherein the photopolymer film comprises urethanes of the general formula (IV)

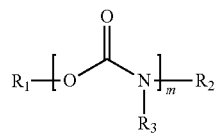

(IV)

in which m is ≥1 and m is ≤8 and $R_1$ is a linear, branched, cyclic or heterocyclic organic radical, optionally substituted by heteroatoms, and $R_2$ and $R_3$ independently of one another are hydrogen.

9. The assembly according to claim 1, wherein a hologram has been exposed into the photopolymer film.

10. A method for producing an assembly according to claim 1, comprising applying a photopolymer formulation comprising a polyisocyanate component, an isocyanate-reactive component, a writing monomer and a photoinitiator to the substrate and curing the photopolymer formulation to form the photopolymer film.

11. A method for producing an isolated photopolymer wherein the photopolymer film and the substrate of an assembly according to claim 1 are separated completely from one another.

* * * * *